US012756361B2

(12) United States Patent
Eleendram et al.

(10) Patent No.: US 12,756,361 B2
(45) Date of Patent: Oct. 6, 2026

(54) SYSTEM AND METHOD OF COMPENSATING CRYSTAL OSCILLATOR PAD LEAKAGE CURRENT

(71) Applicant: NXP B.V., Eindhoven (NL)

(72) Inventors: Harish Eleendram, Tirupati (IN); Anand Kumar Sinha, Noida (IN); Ateet Omer, Kanpur (IN); Siyaram Sahu, Bari Raisen (IN); Vishwajit Babasaheb Bugade, Kolhapur (IN)

(73) Assignee: NXP B.V., Eindhoven (NL)

( * ) Notice: Subject to any disclaimer, the term of this patent is extended or adjusted under 35 U.S.C. 154(b) by 57 days.

(21) Appl. No.: 18/891,556

(22) Filed: Sep. 20, 2024

(65) Prior Publication Data

US 2025/0119098 A1 Apr. 10, 2025

(30) Foreign Application Priority Data

Oct. 4, 2023 (IN) ............................ 202341066496

(51) Int. Cl.
*H03B 5/36* (2006.01)

(52) U.S. Cl.
CPC .................................... *H03B 5/362* (2013.01)

(58) Field of Classification Search
CPC ...................................................... H03B 5/362
USPC ...................................................... 331/116 R
See application file for complete search history.

(56) References Cited

U.S. PATENT DOCUMENTS 5,481,228 A * 1/1996 Badyal ................. H03K 3/0315 331/116 R
6,556,408 B1 4/2003 Zhang
8,854,147 B2 10/2014 Lin
11,368,125 B2 6/2022 Jung et al.
2012/0161888 A1 6/2012 Lahir et al.
2015/0028956 A1* 1/2015 Okamoto .................. H03L 7/16 331/18
2016/0218671 A1* 7/2016 Jun ........................ H03B 5/364

* cited by examiner

*Primary Examiner* — Richard Tan

(57) ABSTRACT

A compensation system for a crystal oscillator including a DC level comparator, current compensation circuitry, and a compensation controller. The crystal oscillator includes an amplifier with a feedback resistance coupled between first and second terminals of a crystal resonator. The DC level comparator may be a hysteretic comparator that compares a DC level of the first node with a DC level of the second node and to provide a corresponding compensation signal. The compensation controller controls a magnitude and direction of the compensation current applied to the first node by the current compensation circuitry based on the compensation signal. The current compensation circuitry sources current to or sinks current from the first node until the leakage current is minimized. The compensation controller may include a digital counter the generates a digital control value used to activate selected current sources or sinks for developing the compensation current.

20 Claims, 8 Drawing Sheets

SYSTEM AND METHOD OF COMPENSATING CRYSTAL OSCILLATOR PAD LEAKAGE CURRENT

FIELD

The present invention relates in general to crystal oscillators, and more particularly to system and method of compensating for leakage current of a pad used for coupling an external crystal resonator of a crystal oscillator.

DESCRIPTION OF THE RELATED ART

A crystal oscillator circuit includes a crystal resonator having terminals connected between the input and output of a transconductance (GM) amplifier. The GM amplifier includes a relatively large feedback resistor, such as several Mega-Ohms (MΩ), depending on the parameters of the crystal resonator. In many configurations the GM amplifier is implemented on an integrated circuit (IC) in which the crystal resonator is connected via a pair of pads of the IC. Leakage current in one of the pads flows through the feedback resistor causing a voltage drop across the feedback resistor. The leakage current manifests as a direct-current (DC) voltage offset between the crystal resonator terminals. The leakage current is often greater in lower semiconductor manufacturing technology processes, such as, for example the 5 nanometer (nm) process. For lower cost ICs and system configurations, pin-count becomes an issue such that the pads coupling the crystal resonator may be shared with other functional circuitry resulting in additional leakage current.

As the leakage current through the feedback resistor becomes more significant, the resulting offset voltage may shift the DC operating point of the GM amplifier, which in turn may prevent the GM amplifier from being able to provide the required gain. As a result, the crystal oscillator may produce no oscillations, or may produce oscillations that are distorted by the common mode DC voltage difference between the crystal terminals. The distorted oscillations cause a degraded duty cycle of an output clock generated by the crystal oscillator.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A compensation system for a crystal oscillator circuit is shown and described. The crystal oscillator circuit includes an amplifier with a feedback resistance coupled between first and second pads which are coupled to first and second terminals, respectively, of a crystal resonator. The compensation system may include a DC level comparator, current compensation circuitry, and a compensation controller. The DC level comparator is configured to compare a DC level of the first pad with a DC level of the second pad and to provide a compensation signal indicative thereof. The current compensation circuitry is configured to apply a compensation current to the first pad. The compensation controller that is configured to control a magnitude and direction of the compensation current based on the compensation signal.

A method of compensating for leakage current of a crystal oscillator circuit is shown and described. The method may include comparing a DC level of an input terminal with a DC level of an output terminal and providing a compensation signal indicative thereof, selecting a direction of compensation based on a state of the compensation signal, when the compensation signal is in a first state, providing a source compensation current to the input terminal and adjusting a level of the source compensation current until the compensation signal transitions to a second state, and when the compensation signal is in the second state, drawing a sink compensation current from the input terminal and adjusting a level of the sink compensation current until the compensation signal transitions to the first state.

Figure 1:
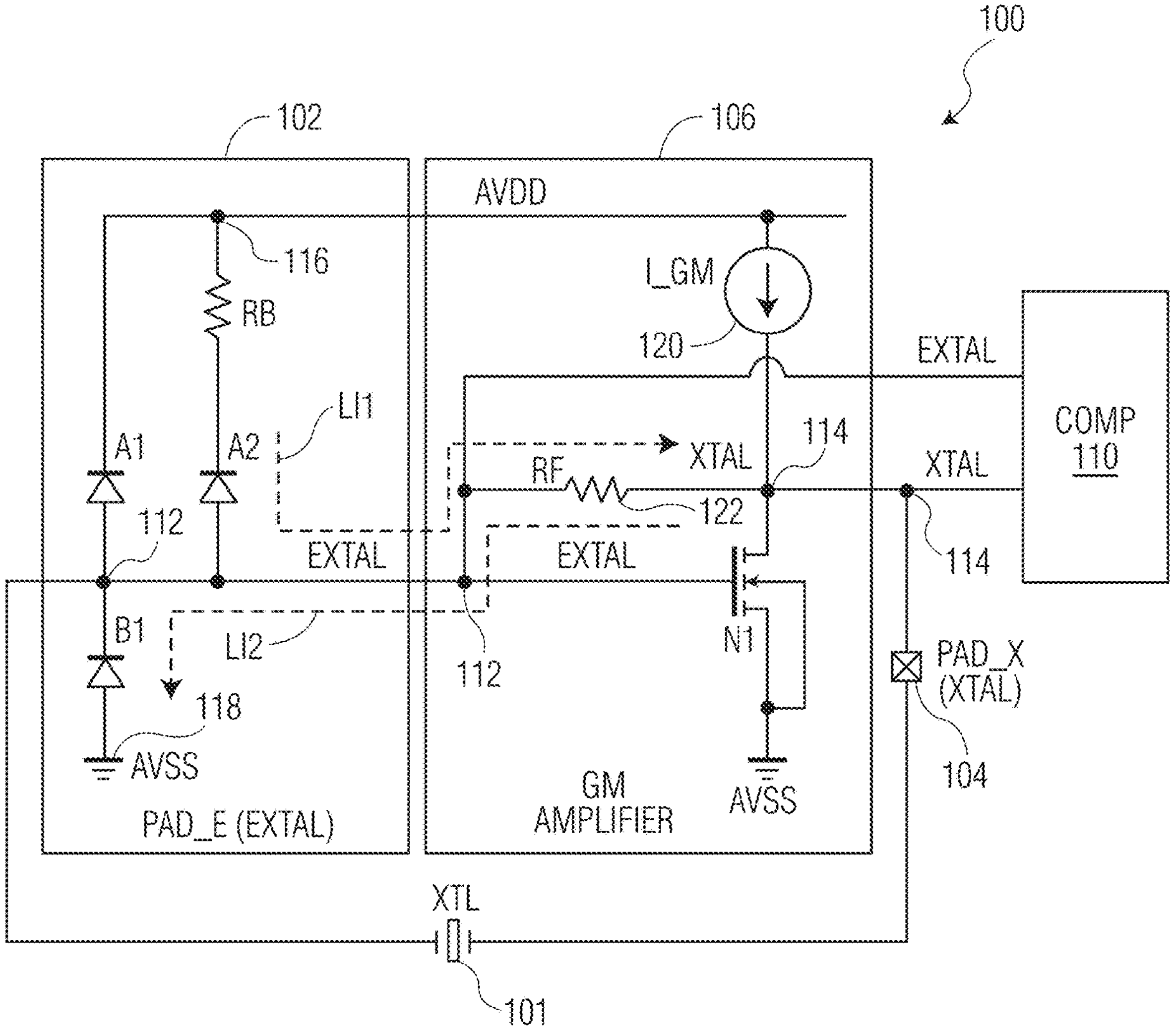
FIG. 1 is a simplified block diagram of a crystal oscillator circuit coupled to a leakage compensation circuit implemented according to one embodiment for compensating leakage current.

FIG. 1 is a simplified block diagram of a crystal oscillator circuit 100 coupled to a leakage compensation circuit 110 implemented according to one embodiment for compensating leakage current. The crystal oscillator circuit 100 includes a crystal resonator (XTL) 101 coupled between a first input/output (I/O) pad labeled PAD_E 102 and a second I/O pad labeled PAD_X of a crystal oscillator integrated circuit (IC) incorporating the crystal oscillator circuit 100 and the leakage compensation circuit 110. Additional external circuitry, such as capacitors and resistors or the like, may be coupled to the XTL 101 but are not shown. PAD_E 102 internally includes a node 112 (coupled to a first terminal of XTL 101) which develops a signal EXTAL and PAD_X 104 includes (or is otherwise internally coupled to) a node 114 (coupled to a second terminal of XTL 101) developing a signal XTAL within the crystal oscillator IC. EXTAL on node 112 is coupled to an input of a transconductance (GM) amplifier 106 having an output coupled to XTAL on node 114. The GM amplifier 106 is generally configured to excite or otherwise stimulate the XTL 101 to generate oscillation signals on EXTAL and XTAL.

The GM amplifier 106 is coupled between a positive analog supply voltage AVDD provided on an internal supply node 116 and a negative analog supply voltage AVSS provided on another internal supply node 118, in which AVSS is otherwise referred to herein as analog ground. In one embodiment, the GM amplifier 106 includes a current source 120 providing a source current I_GM, a feedback resistor 122 with a resistance RF, and an N-type or N-channel MOS (NMOS) transistor N1. The current source 120 has an input coupled to AVDD and an output that provides the source current I_GM to XTAL (node 114). The feedback resistor 122 is coupled between XTAL (node 114) and EXTAL (node 112). N1 has a drain terminal coupled to XTAL, a gate terminal coupled to EXTAL, and a source terminal coupled to AVSS. N1 may have an internal bulk connection coupled to its source terminal.

The PAD_E 102 includes additional circuitry that may provide at least one path for leakage current, among other possible current paths. As shown, the PAD_E 102 includes electrostatic discharge (ESD) circuitry including diodes A1, A2, and B1, and a resistor RB. A1 has an anode coupled to node 112 (EXTAL) and a cathode coupled to AVDD. A2 has an anode coupled to node 112 and a cathode coupled to one end of resistor RB, having its other end coupled to AVDD. B1 has an anode coupled to AVSS and a cathode coupled to node 112. A first leakage current LI1 is shown flowing through A2 (and/or A1) and through feedback resistor 122, and a second leakage current LI2 is shown flowing through feedback resistor 122 and through diode B1. The resistance RF of the feedback resistor 122 may be relatively large, such as several Mega-Ohms (MΩ) (e.g., 5-10 MΩ), so that even a relatively small amount of leakage current in either direction causes a significant voltage drop across resistance RF causing a relatively large direct-current (DC) voltage offset between EXTAL and XTAL. The DC voltage offset between EXTAL and XTAL may shift the DC operating point of the GM amplifier 106, which in turn may prevent the GM amplifier 106 from being able to provide the required gain to establish or sustain successful oscillation. As a result, the crystal oscillator may produce no oscillations, or may produce oscillations that are distorted by the common mode DC voltage offset resulting in degraded duty cycle of an output clock generated by the crystal oscillator.

Figure 2:
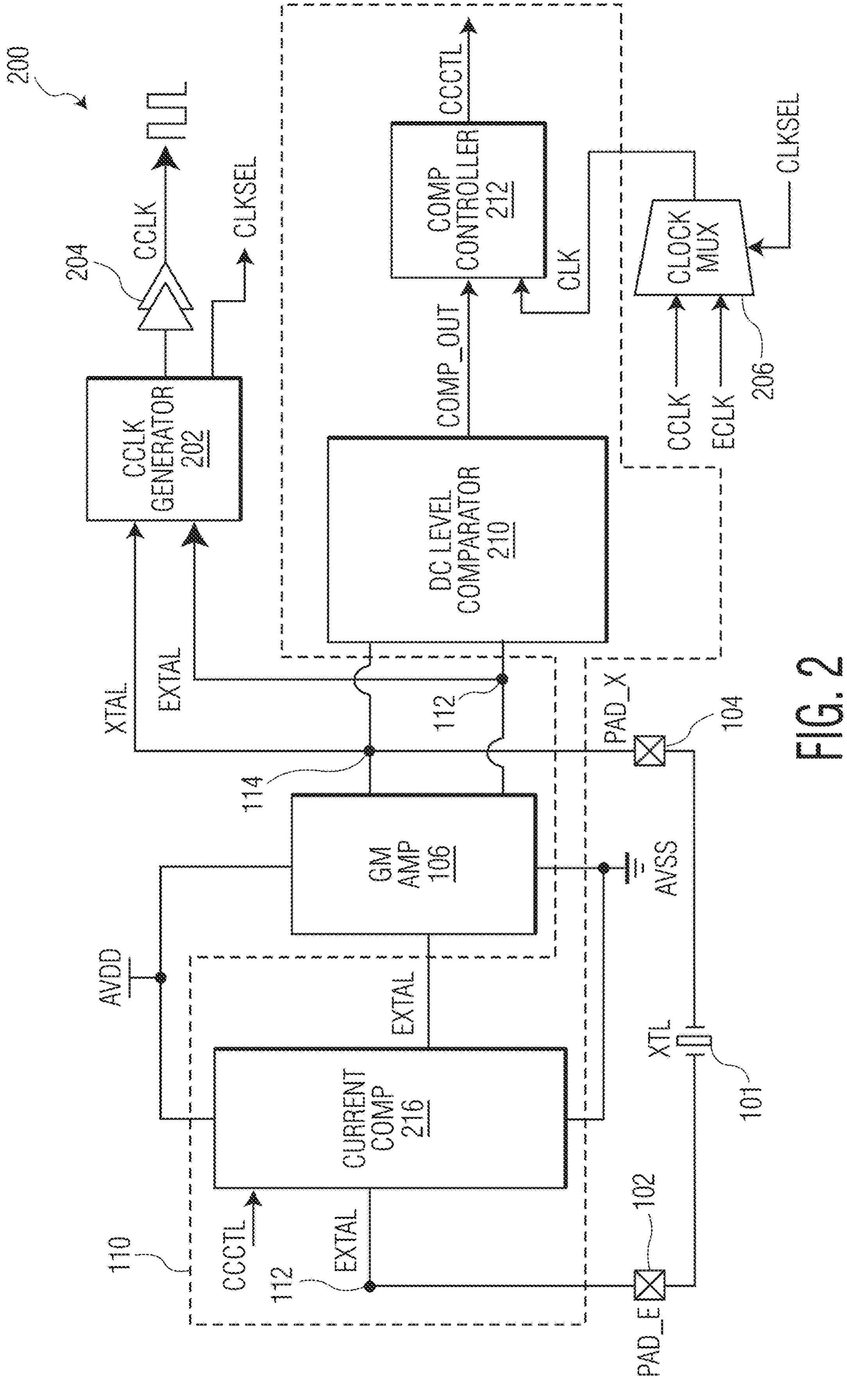
FIG. 2 is a simplified block diagram of a crystal oscillator clock circuit including the crystal oscillator circuit of FIG. 1 and showing additional details of the leakage compensation circuit of FIG. 1 implemented according to one embodiment.

FIG. 2 is a simplified block diagram of a crystal oscillator clock circuit 200 including the crystal oscillator circuit 100 and showing additional details of the leakage compensation circuit 110 implemented according to one embodiment. The crystal resonator XTL 101 is shown coupled between pads 102 and 104 which are further coupled internally to EXTAL (node 112) and XTAL (node 114), respectively, within the crystal oscillator IC. The GM amplifier 106 is coupled between AVDD and AVSS and is further coupled to EXTAL and XTAL as previously described. The crystal oscillator clock circuit 200 includes a crystal clock (CCLK) generator 202 having inputs coupled to EXTAL and XTAL and an output coupled through a clock buffer 204 providing a crystal clock signal CCLK. The CCLK generator 202 provides a clock select signal CLKSEL to a select input of a clock select multiplexer (MUX) 206, having a first input receiving the crystal clock signal CCLK, a second input receiving an external clock signal ECLK, and an output providing a selected clock signal CLK to a compensation (COMP) controller 212 within the leakage compensation circuit 110. ECLK is provided by external clock circuitry (not shown) having sufficient accuracy for initializing operation.

Upon power on or restart/reset (POR) of the crystal oscillator clock circuit 200, the GM amplifier 106 begins driving the crystal resonator XTL 101 in an attempt to generate oscillation on the EXTAL and XTAL signals. The CLKSEL signal initially selects ECLK to provide ECLK as CLK to the compensation controller 212. The CCLK generator 202 receives and senses oscillation via one or both the EXTAL and XTAL signals for generating CCLK, but monitors the characteristics of oscillation including stability and duty cycle. The CCLK generator 202 asserts CLKSEL to select ECLK until balanced oscillation on both EXTAL and XTAL is achieved such that CCLK achieves successful oscillation meaning stable oscillation with a duty cycle within a predetermined acceptable margin of error.

The leakage compensation circuit 110 includes a DC level comparator 210 that generates a comparator output signal COMP_OUT based on the voltage offset between EXTAL and XTAL. The leakage compensation circuit 110 includes the compensation controller 212 that generates a compensation current control (CCCTL) signal based on the COMP_OUT signal, in which the CCCTL signal is provided to an input of the current compensation circuit 216. The CCCTL signal may have any suitable format but generally indicates the direction and magnitude of compensation current to be applied to the node 112 to compensate for leakage current. The current compensation circuit 216 uses the CCCTL signal to apply the indicated amount of compensation current in the indicated direction as further described herein. When the leakage current is sufficiently compensated, the DC voltage offset between EXTAL and XTAL is sufficiently reduced so that CCLK achieves successful oscillation (meaning that CCLK achieves stable oscillation with a duty cycle within a predetermined acceptable margin of error), so that the CCLK generator 202 switches CLKSEL to select CCLK. In one embodiment, the leakage compensation circuit 110 operates continuously or periodically over time to automatically compensate for leakage current over time and during changes in operation or operating conditions such as, for example, changes in temperature.

Figure 3:
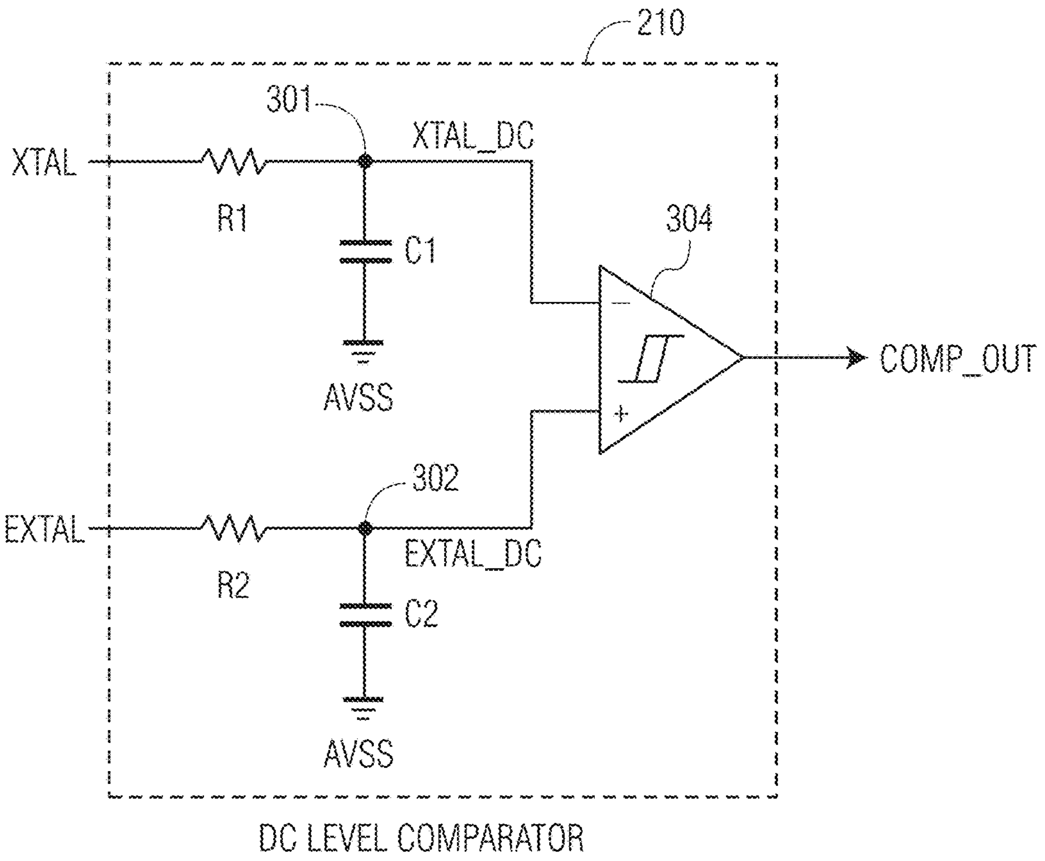
FIG. 3 is a schematic diagram of the DC level comparator of FIG. 2 implemented according to one embodiment.

FIG. 3 is a schematic diagram of the DC level comparator 210 implemented according to one embodiment. XTAL is provided through a resistor R1 to a node 301 developing a voltage XTAL_DC, which is provided to a negative (or inverting) input of a hysteretic comparator 304. A capacitor C1 is coupled between node 301 and AVSS. EXTAL is provided through another resistor R2 to a node 302 developing a voltage EXTAL_DC, which is provided to a positive (or non-inverting) input of the hysteretic comparator 304. A capacitor C2 is coupled between node 302 and AVSS. The hysteretic comparator 304 has an output providing the COMP_OUT signal. The resistance of R1 and the capacitance of C1 are selected to filter alternating-current (AC) voltage from XTAL so that XTAL_DC is developed at the DC level of XTAL. Similarly, the resistance of R2 and the capacitance of C2 are selected to filter AC voltage from EXTAL so that EXTAL_DC is developed at the DC level of EXTAL. The hysteretic comparator 304 asserts COMP_OUT as a binary signal that indicates which of XTAL_DC and EXTAL_DC is greater.

Figure 4:
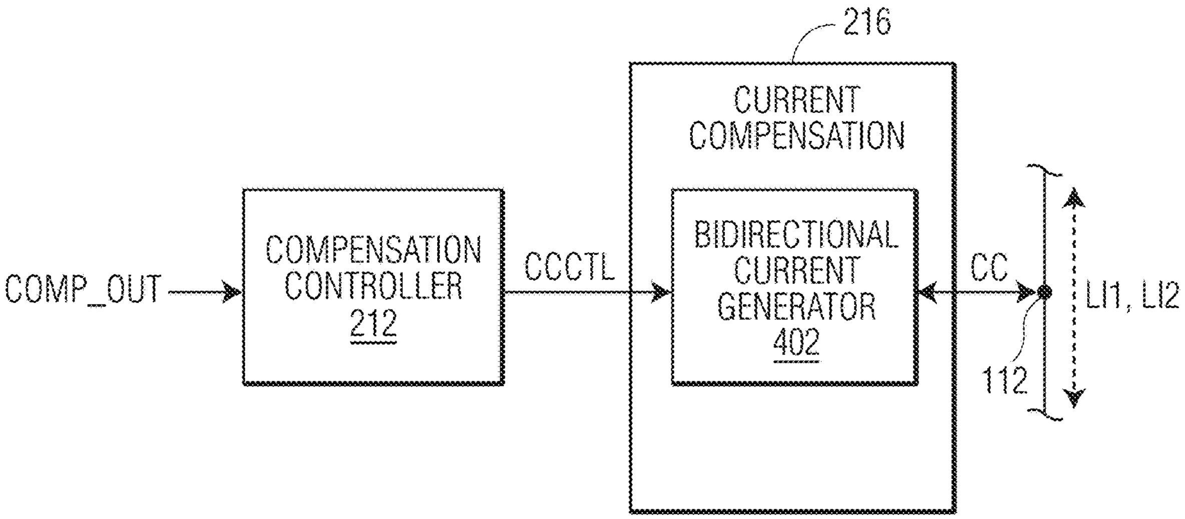
FIG. 4 is a simplified block diagram of the compensation controller and the current compensation circuit of FIG. 2 configured according to one embodiment.

FIG. 4 is a simplified block diagram of the compensation controller 212 and the current compensation circuit 216 configured according to one embodiment. As previously described, the compensation controller 212 generates the CCCTL signal based on the COMP_OUT signal and provides the CCCTL signal to the current compensation circuit 216. The CCCTL signal indicates the direction and magnitude of compensation current to be applied to the node 112 to compensate for leakage current as further described herein. In this case, the current compensation circuit 216 is configured as, or otherwise includes, a bidirectional current generator 402 which generates a compensation current (CC) based on the CCCTL signal and which applies the compensation current CC to node 112. The current generator 402 may source current to or sink current from node 112 at a suitable magnitude sufficient to compensate for the applicable leakage current LI1 or LI2 in either direction. When the source leakage current LI1 is dominant, then the bidirectional current generator 402 operates to sink compensation current from node 112 until a net current through node 112 is less than a predetermined maximum level. When the sink leakage current LI2 is dominant, then the bidirectional current generator 402 operates to source compensation current to node 112 until the net current through node 112 is less than the predetermined maximum level. The predetermined maximum level is determined based on a maximum allowable offset voltage across the feedback resistor 122 that allows successful oscillation. The CCCTL signal may have any suitable form, including digital or analog formats, and may include one or more separate signals depending upon the form and configuration.

Figure 5:
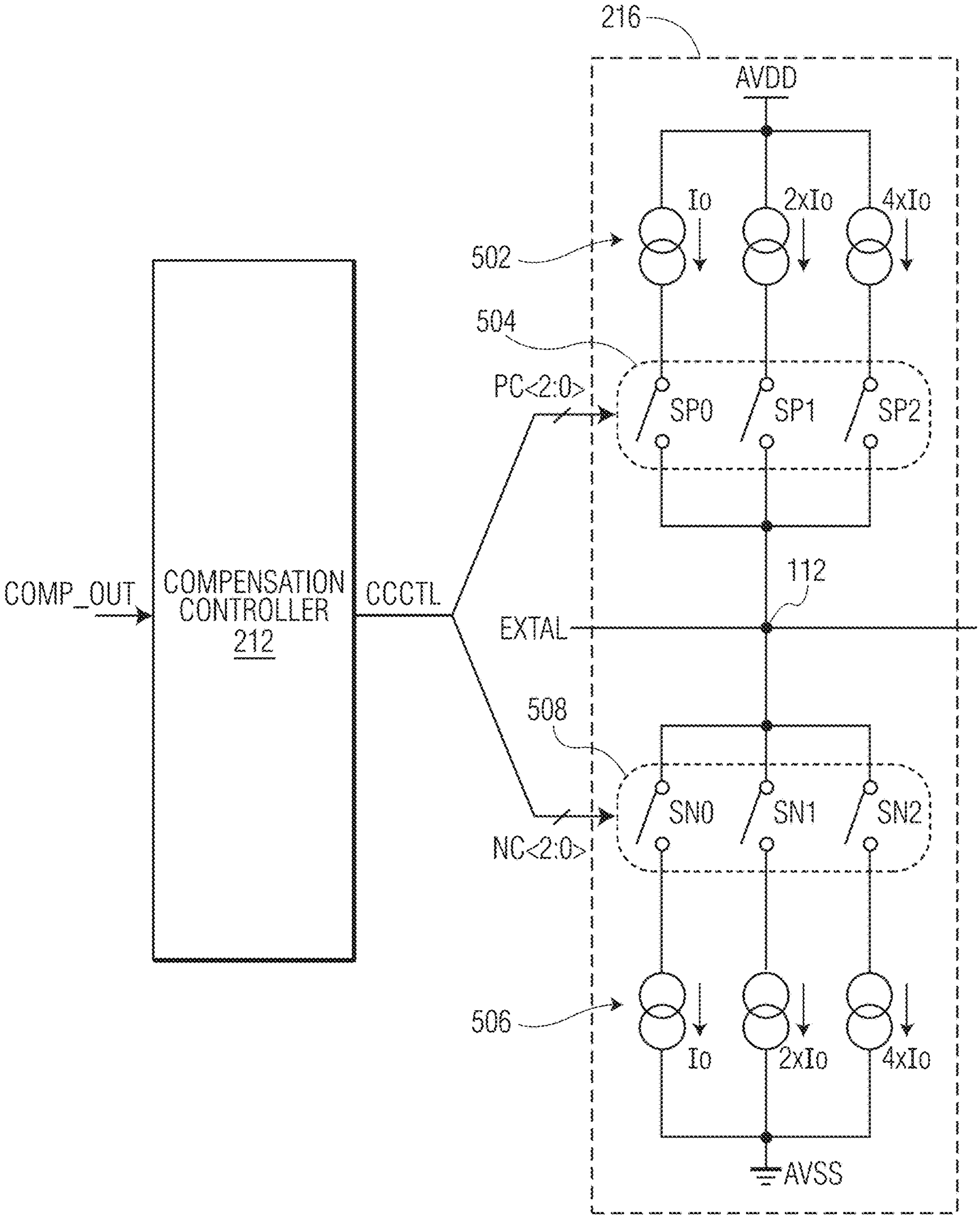
FIG. 5 is a schematic diagram of the compensation controller and the current compensation circuit of FIG. 1 implemented according to another embodiment.

FIG. 5 is a schematic diagram of the compensation controller 212 and the current compensation circuit 216 implemented according to another embodiment. The current compensation circuit 216 includes a series of N+1 current sources 502 and a corresponding series of N+1 source switches 504, and a series of N+1 current sinks 506 and a corresponding series of N+1 sink switches 508. In the illustrated embodiment, N=2 although N may be any suitable integer greater than or less than 2 for a given implementation. Each of the current sources 502 has an input coupled to AVDD and an output coupled to a corresponding one of the source switches 504. Each of the source switches 504 is configured as a single-pole-single throw (SPST) switch controlled by a corresponding one of a set of digital control signals PC<N:0>, which is PC<2:0> for N=2. Each of the source switches 504 has a first switched terminal coupled to an output of a corresponding one of the current sources 502 and a second switched terminal coupled to node 112 (EXTAL). For N=2, the source switches 504 include a first switch SP0 controlled by PC<0>, a second switch SP1 controlled by PC<1>, and a third switch SP2 controlled by PC<2>.

Each of the current sinks 506 has an output coupled to AVSS and an input coupled to a corresponding one of the sink switches 508. Each of the sink switches 508 is configured as a SPST switch controlled by a corresponding one of a set of digital control signals NC<N:0>, which is NC<2:0> for N=2. Each of the sink switches 508 has a first switched terminal coupled to an input of a corresponding one of the current sinks 506 and a second switched terminal coupled to node 112 (EXTAL). For N=2, the sink switches 508 include a first switch SN0 controlled by NC<0>, a second switch SN1 controlled by NC<1>, and a third switch SN2 controlled by NC<2>.

It is noted that controlling the source switches 504 using the digital control signals PC<N:0> effectively activates selected ones of the current sources 502 for controlling a level or magnitude of the corresponding compensation source current. In an alternative embodiment, each of the current sources 502 may be configured to be directly activated or deactivated by a corresponding one of the PC<N:0> signals. In a similar manner, controlling the sink switches 508 using the digital control signals NC<N:0> effectively activates selected ones of the current sinks 506 for controlling a level or magnitude of the corresponding compensation sink current. In an alternative embodiment, each of the current sinks 506 may be configured to be directly activated or deactivated by a corresponding one of the NC<N:0> signals.

The series of current sources 502 are binarily weighted and based on a unit current level Io. In the illustrated configuration for N=2, a first current source provides a unit current Io to the first switch SP0, a second current source provides a current 2×Io to the second switch SP1, and a third current source provides a current 4×Io to the third switch SP2, in which "x" denotes multiplication. When any one of the PC<N:0> control signals is at a first logic state, such as logic 0, then the corresponding one of the source switches 504 is opened, and when at a second logic state, such as logic 1, then the corresponding one of the source switches 504 is closed. When closed, then the current from the corresponding current source is provided to node 112 (EXTAL), and when opened, the current is not provided. In this manner, PC<2:0> control signals (for N=2) can be controlled to deliver a selected source current of 0, Io, 2×Io, . . . , 7×Io in increments of Io to EXTAL.

The series of current sinks 506 are binarily weighted in a similar manner also based on the unit current level Io, in which a first current sink sinks a unit current Io through the first switch SN0, a second current sink sinks a current 2×Io through the second switch SN1, and a third current sink sinks a current 4×Io through the third switch SN2. The lower switches SN0, SN1, and SN2 are controlled by the NC<0>, NC<1>, and NC<2> control signals, respectively, in a similar manner. When closed, then the current drawn from the corresponding current sink is pulled from node 112 (EXTAL), and when opened, the current is not pulled. In this manner, NC<2:0> control signals (for N=2) can be controlled to sink a selected current of 0, Io, 2×Io, . . . , 7×Io in increments of Io from EXTAL.

It is noted that the current compensation circuit 216 illustrated in FIG. 5 is only one embodiment in which many different variations are contemplated. Increased resolution may be achieved by increasing N and the corresponding number of current sources and sinks. Also, rather than a common unit current Io, the current sources 502 and current sinks 506 may have different unit current values. The compensation controller 212 may be implemented such a way that current compensation resolution increase by adjusting PC<N:0> and NC<N:0> together. Improved resolution may be achieved by a difference of unit values of sink current and source current. In addition, rather than having a series of switched current devices for both source and sink current compensation, digitally-controlled, voltage-controlled or even current-controlled current devices may be implemented.

When the current compensation circuit 216 is configured as shown in FIG. 5, then the compensation controller 212 generates the CCCTL signal as the digital control signals PC<N:0> and NC<N:0> based on successive sampling of the COMP_OUT signal as further described herein, in which "N" is an integer greater than zero. As described further herein, the compensation controller 212 samples COMP_OUT in a programmable number of clock cycles for successively adjusting the PC<N:0> and NC<N:0> control signals to establish sufficient compensation current by the current compensation circuit 216 to offset leakage current in either direction through the feedback resistor 122 to reduce or otherwise eliminate offset voltage across the feedback resistor 122 sufficient to establish successful oscillation of XTAL/EXTAL and CCLK.

With reference to FIG. 1, when the leakage current LI1 dominates such that the net leakage current from EXTAL through the feedback resistor 122 to XTAL reduces the voltage level of XTAL relative to EXTAL by a DC offset voltage that either prevents balance EXTAL/XTAL oscillation or that prevents CCLK (FIG. 2) from achieving successful oscillation (meaning, no oscillation or oscillation with degraded duty cycle), then the compensation controller 212 opens each of the source switches 504 (to deselect source current) and closes an appropriate combination of the sink switches 508 to sink an amount of current from EXTAL to AVSS to offset the net leakage current LI1 by a sufficient amount to enable successful oscillation. On the other hand, when the leakage current LI2 dominates such that the net leakage current from XTAL through the feedback resistor 122 to EXTAL increases the voltage level of XTAL relative to EXTAL by a DC offset voltage that either prevents oscillation or prevents CCLK from achieving successful oscillation (such as having degraded duty cycle), then the compensation controller 212 opens each of the sink switches 508 (to deselect sink current) and closes an appropriate combination of the upper switches 502 to source an amount of current to EXTAL from AVDD to offset the net leakage current LI2 by a sufficient amount to enable successful oscillation of CCLK.

The value of Io should be selected for a given configuration as the maximum amount of current that may flow through the feedback resistor 122 in either direction that can be tolerated while such that oscillation of XTAL/EXTAL is sustained and CCLK achieves successful oscillation. The value of N, which defines the number of current sources 502 and current sinks 506 and corresponding source and sink switches 504 and 508, is defined such that the maximum source/sink current $(2^{N+1}-1)\times Io$ is sufficiently greater than an expected (or theoretical) maximum amount of leakage current in either direction for a given implementation. In this manner, the unit current level Io and the value of N are selected to provide a sufficient level of compensation current in either direction to offset leakage current to enable successful oscillation of XTAL/EXTAL and so that CCLK achieves successful oscillation (i.e., achieves stable oscillation with a duty cycle within a predetermined acceptable margin of error).

Figure 6:
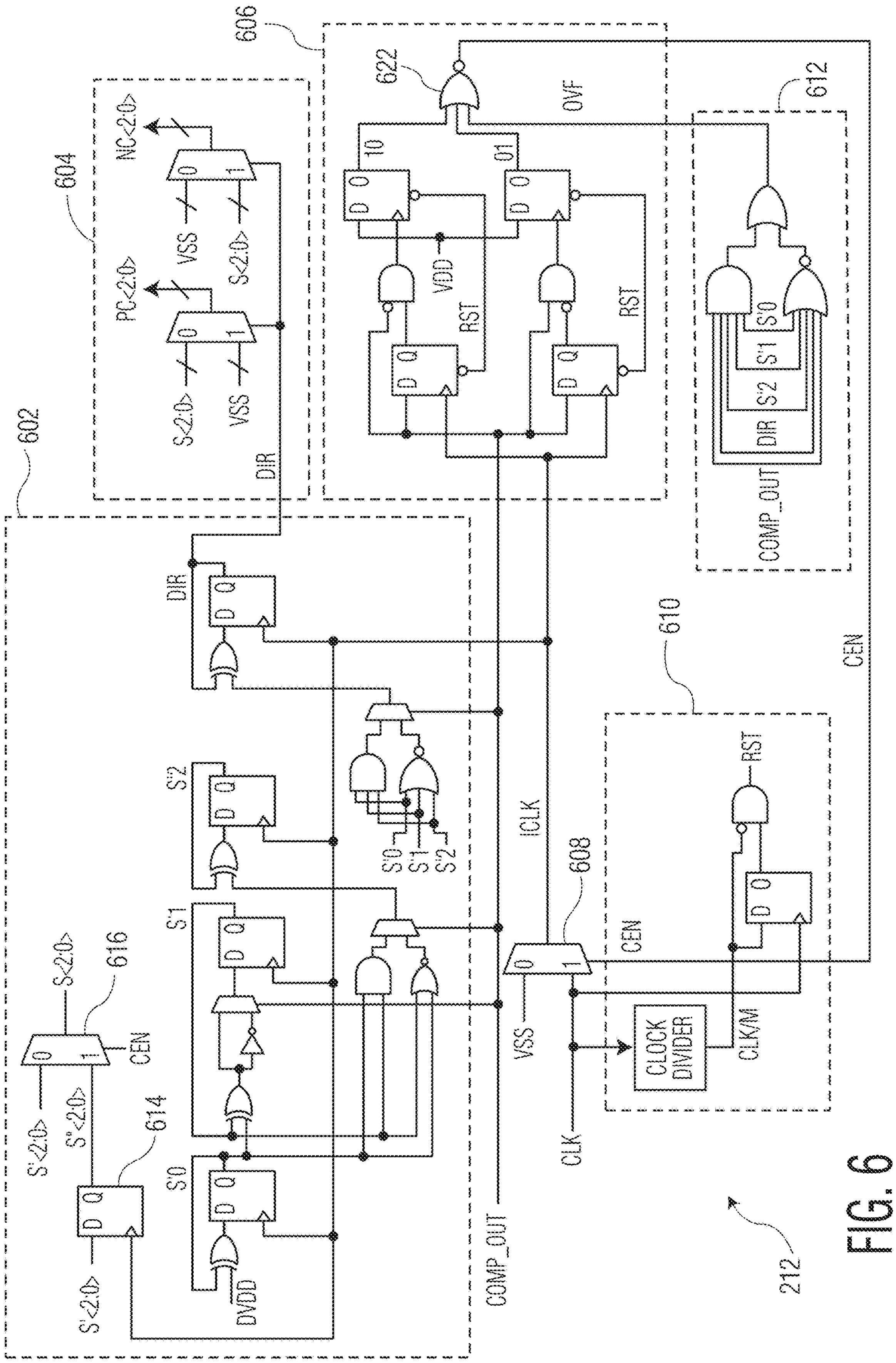
FIG. 6 is a schematic diagram of the compensation controller of FIG. 2 implemented according to one embodiment for controlling the current compensation circuit shown in FIG. 5.

FIG. 6 is a schematic diagram of the compensation controller 212 implemented according to one embodiment for controlling the current compensation circuit 216 configured as shown in FIG. 5. The compensation controller 212 includes a 4-bit binary counter 602, an output select circuit 604, a transition detector 606, a clock enable MUX 608, a delay circuit 610, and an overflow circuit 612. The clock enable MUX 608 has a logic 1 input receiving CLK from the clock select MUX 206, a logic 0 input receiving a negative digital supply voltage VSS (or, digital ground at logic 0), a select input receiving a clock enable signal CEN, and an output providing an internal clock signal ICLK which is selected from VSS or CLK depending upon the state of CEN. When CEN is logic 1, CLK is selected and provided as the internal clock ICLK which becomes active and toggled as a copy of CLK. When CEN is logic 0, VSS is selected as ICLK which becomes inactive and held low.

The counter 602 is a 4-bit bidirectional counter controlled by COMP_OUT and ICLK producing 3 preliminary count bits S'0, S'1, S'2, and DIR, in which S'0 is the least significant bit (LSB) and DIR is the most significant bit (MSB). DIR is used as a compensation current direction bit for selecting between source current or sink current as further described herein. The count bits S'0, S'1, and S'2 (S'<2:0>) are used to develop magnitude bits S<2:0> for controlling either the source switches 504 when DIR=0 or the sink switches 506 when DIR=1 for determining the magnitude of the compensation current. When COMP_OUT is 0 and while ICKL is active (CEN=1), the counter 602 increments S'<2:0> with each cycle of ICLK and when COMP_OUT is 1, the counter 602 decrements S'<2:0> with each cycle of ICLK. In addition, a set of D type flip-flops (DFFs) 614 generate next state count bits S"<2:0>. A set of MUXes 616 select between the count bits S'<2:0> and the next state count bits S"<2:0> based on the state of CEN to provide the magnitude bits S<2:0>, in which S<2:0>=S"<2:0> while CEN=1 (while ICLK is active) and S<2:0>=S'<2:0> when CEN=0 (when ICLK becomes inactive).

The output select circuit 604 includes a first set of MUXes 618 that selects the magnitude bits S<2:0> as the the digital control signals PC<2:0> when DIR=0 or that sets each of the digital control signals PC<2:0> to zero when DIR=1. Similarly, the output select circuit 604 includes a second set of MUXes 620 that selects the magnitude bits S<2:0> as the digital control signals NC<2:0> when DIR=1 or that sets each of the digital control signals NC<2:0> to zero when DIR=0.

The transition detector 606 detects a transition of COMP_OUT from 0 to 1 or from 1 to 0 while ICLK is active. The transition detector 606 includes a 3-input NOR gate 622 having respective inputs receiving signals 10, 01, and OVF, and has an output providing the CEN clock enable signal. A reset signal RST clears both 10 and 01 to 0 and OVF remains at 0 unless an overflow condition is detected by the overflow circuit 612 as further described herein. When 10, 01 and OVF are each logic 0, CEN=1 so that ICLK is active (as a copy of CLK). When COMP_OUT transitions from 0 to 1 while ICLK is active, then signal 01 goes high to logic 1 so that the NOR gate 622 pulls CEN low to logic 0 to deactivate ICLK. Similarly, when COMP_OUT transitions from 1 to 0 while ICLK is active, then 10 goes high to logic 1 so that the NOR gate 622 pulls CEN low to logic 0 to deactivate ICLK. ICLK remains inactive until RST is next pulsed high to clear 10 and 01.

The delay circuit 610 divides CLK by an integer value M to provide a divided clock signal CLK/M, in which M is a programmable value. The delay circuit 610 normally asserts the reset signal RST low. Each time CLK/M transitions from 1 to 0 after one full cycle of CLK/M, the delay circuit 610 pulses RST high for one CLK cycle to reset the transition detector 606 which then re-activates ICLK for the next iteration for sampling COMP_OUT.

In operation of the compensation controller 212, after the CLK/M delay from the previous cycle, the delay circuit 610 pulses RST high to reset the transition detector 606 so that CEN is asserted to logic 1. When CEN=1, ICLK is activated and the counter 602 increments or decrements S'<2:0> based on the level of COMP_OUT, and the magnitude bits S<2:0> are updated one ICLK later by the MUXes 616 using the next state count bits S"<2:0>. The digital control signals PC<2:0> are updated accordingly to adjust the magnitude of the compensation source current while DIR=0 or to adjust the magnitude of the compensation sink current while DIR=1. When COMP_OUT transitions, CEN is pulled low to 0 to deactivate ICLK to lock the compensation current until the next reset determined by CLK/M. When CEN transitions from 1 to 0, the magnitude bits S<2:0> are locked back to the previous step (or count) of S'<2:0> by the MUXes 616.

The overflow circuit 612 monitors the count bits S'0, S'1, and S'2, the DIR bit, and the COMP_OUT signal for determining an overflow condition. OVF is held low at logic 0 when any one of these 5 signals are logically different, which is the normally expected condition. However, when all 5 of these signals are at the same logic value (e.g., all 0's or all 1's), then the overflow condition is detected (or about to occur) and OVF is asserted high to pull CEN low to deactivate ICLK. An overflow condition is an unexpected error condition that may be handled by software or additional circuitry that is not shown or described.

Figure 7:
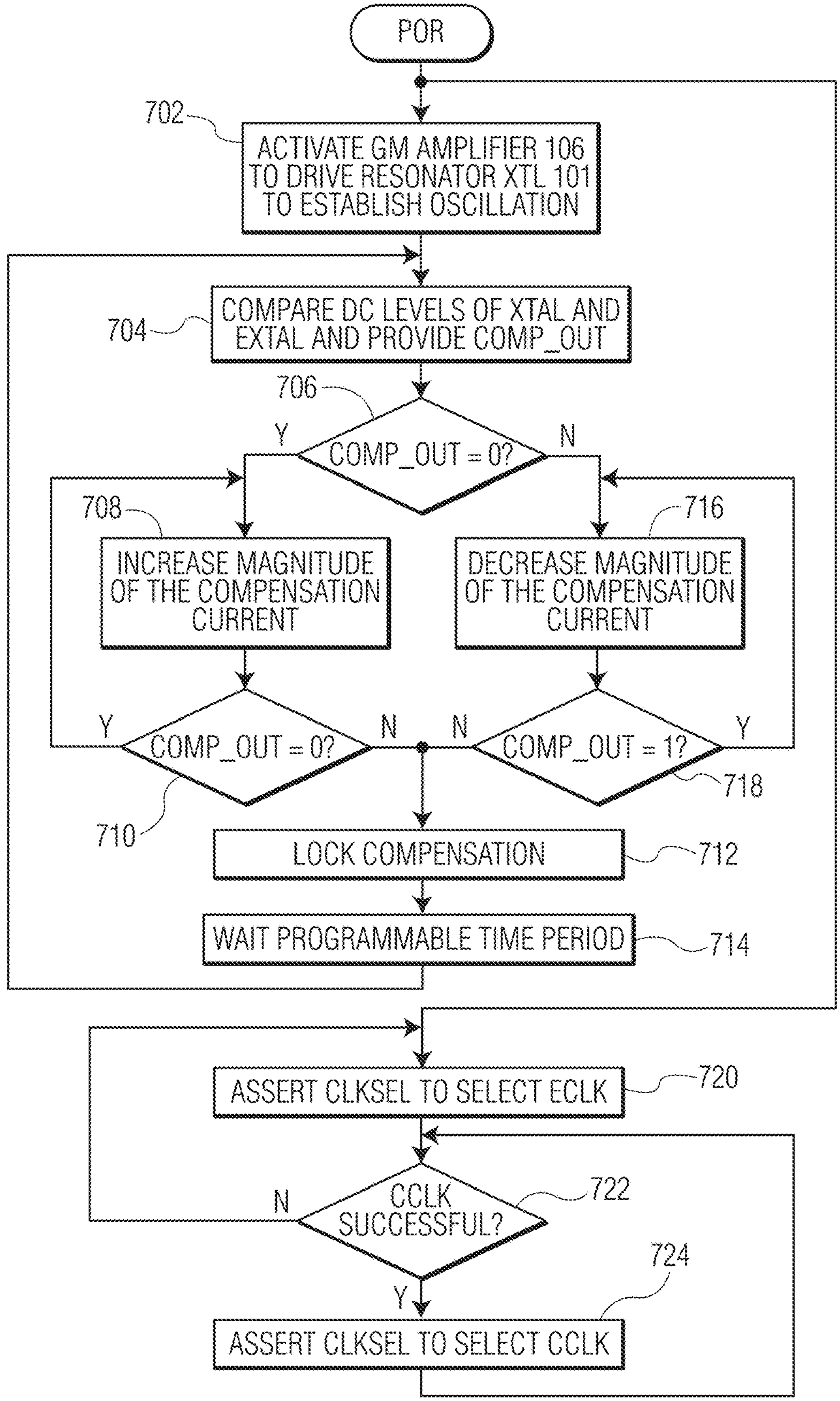
FIG. 7 is a flowchart diagram illustrating operation of the crystal oscillator clock circuit of FIG. 2 according to one embodiment.

FIG. 7 is a flowchart diagram illustrating operation of the crystal oscillator clock circuit 200 according to one embodiment. Upon POR of the crystal oscillator clock circuit 200 at a first block 702, the GM amplifier 106 begins driving the crystal resonator XTL 101 in an attempt to establish oscillation on the EXTAL and XTAL signals. At a next block 704, the DC level comparator 210 compares the DC levels of XTAL and EXTAL (e.g., XTAL_DC compared to EXTAL_DC by the hysteretic comparator 404) and provides the COMP_OUT binary signal. At next block 706, it is queried whether COMP_OUT=0. If COMP_OUT=0 as determined at block 706, operation advances to block 708 in which the compensation controller 212 increases the magnitude of the compensation current. When the current compensation circuit 216 is configured as shown in FIG. 5, then the compensation controller 212 increments by one current unit Io the magnitude of the compensation current provided by the current compensation circuit 216 by adjusting an operative one of the PC<N:0> or NC<N:0> control signals. It is noted that selection between PC<N:0> and NC<N:0> determines the direction of the compensation current meaning whether the source switches 504 are updated by PC<N:0> to adjust source current provided by the current sources 502, or whether the sink switches 508 are updated by NC<N:0> to adjust sink current pulled by the current sinks 506. Operation then advances in the next clock cycle to block 710 to query again whether COMP_OUT=0 after the current has been increased. If COMP_OUT remains at 0, then operation loops back to block 708 to again increase the magnitude of the compensation current. Operation loops between blocks 708 and 710 to successively increase the compensation current (or increment the compensation current by Io) each clock cycle until COMP_OUT=1.

When COMP_OUT=1 as determined at block 710, then the DC level comparator 210 has toggled from 0 to 1 from block 706 to block 710 and operation instead advances to block 712 in which the compensation current is locked. When the current compensation circuit 216 is configured as shown in FIG. 5, then the compensation is locked at the previous step as previously described. Operation then advances to block 714 in which the compensation controller 210 waits a programmable time period before continuing operation. After expiration of the time period, operation loops back to block 704 to repeat the process for the next iteration.

Referring back to block 706, if COMP_OUT=1 as determined at block 706, then operation advances instead to block 716 in which the compensation controller 212 decreases the magnitude of the compensation current. When the current compensation circuit 216 is configured as shown in FIG. 5, then the compensation controller 212 decrements by one current unit Io the magnitude of the compensation current provided by the current compensation circuit 216 by adjusting an operative one of the PC<N:0> or NC<N:0> control signals. Again, selection between PC<N:0> and NC<N:0> determines the direction of the compensation current as previously described. Operation then advances in the next clock cycle to block 718 to query whether COMP_OUT=1 after the current has been decreased. If COMP_OUT remains at 1, then operation loops back to block 716 to again decrease the magnitude of the compensation current. Operation loops between blocks 716 and 718 to successively decrease the compensation current (e.g., decrement compensation current by Io) each clock cycle until COMP_OUT=0.

When COMP_OUT=0 as determined at block 718, then the DC level comparator 210 has toggled from 1 to 0 from block 706 to block 718 and operation instead advances to block 712 in which the compensation current is locked as previously described. Operation then advances to block 714 in which the compensation controller 210 waits the programmable time period, and then back to block 704 to repeat the process for the next iteration. Operation continues to loop until the next POR or when power is turned off.

After POR, in parallel with current compensation performed by blocks 702 to 718, operation also advances to block 720 in which the CCLK generator 202 initially asserts CLKSEL to select the external clock signal ECLK. Operation advances to next block 722 in which the CCLK generator 202 determines whether CCLK is successful, meaning CCLK has achieved stable oscillation with a duty cycle within a predetermined acceptable margin of error as previously described. If CCLK has not yet achieved successful oscillation, operation loops back to block 720, and operation loops between blocks 720 and 722 until CCLK is determined to be successful. When CCLK is successful as determined at block 722, operation loops instead to block 724 in which the CCLK generator 202 asserts CLKSEL to select the internal crystal clock signal CCLK. While CCLK maintains successful oscillation, operation continuously loops between blocks 722 and 724. If CCLK fails for any reason during operation or upon subsequent POR, then operation loops back to block 720 to again select ECLK until CCLK is successful.

Figure 8:
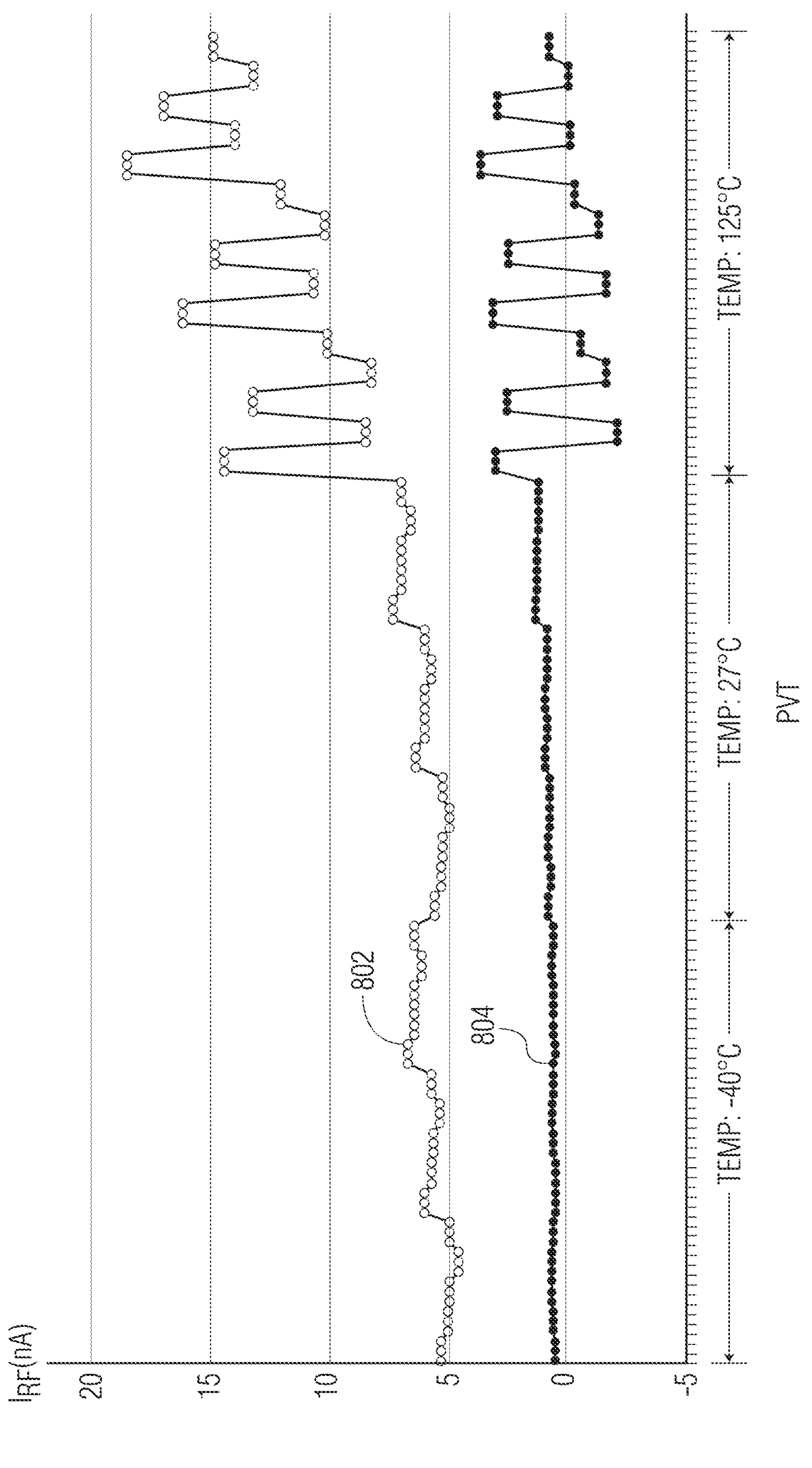
FIG. 8 are plots of the current IRF through the feedback resistor of FIG. 1 without leakage current compensation and with leakage current compensation versus process, voltage, and temperature (PVT) corners by varying voltage and process variables within selected temperature ranges for a typical configuration according to one embodiment.

FIG. 8 are plots of the current IRF through the feedback resistor 122 without leakage current compensation (plot 802) and with leakage current compensation (plot 804) versus process, voltage, and temperature (PVT) corners by varying voltage and process variables within selected temperature ranges −40° Centigrade (° C.), 27° C., and 125° C. for a typical configuration according to one embodiment. The IRF current is shown in nano-Amperes (nA) although an alternative current scale may be applicable in different configurations. In the typical process case at a normal temperature (27° C.) without leakage current compensation the leakage current is about 6 nA (shown by plot 802), whereas with compensation the leakage current is minimized to less than 1 nA (shown by plot 804). At fast process and high temperature (125° C.) without leakage current compensation the leakage current rise to about 18 nA (shown by plot 802), whereas with compensation the leakage current is minimized to less than 3.5 nA (shown by plot 804).

Figure 9:
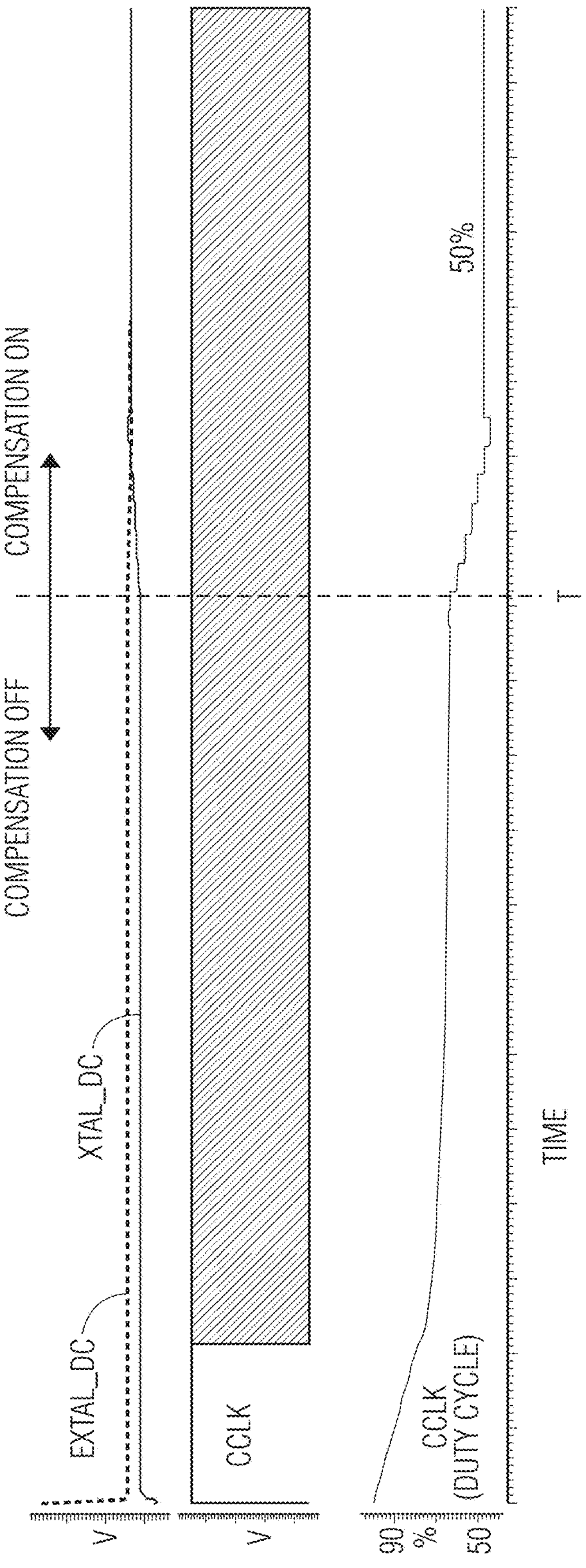
FIG. 9 is a series of plots including EXTAL_DC plotted with XTAL_DC, CCLK, and the duty cycle of CCLK, each versus time before and after leakage current compensation for a typical configuration according to one embodiment.

FIG. 9 is a series of plots including EXTAL_DC plotted with XTAL_DC (Voltage), CCLK (Voltage), and the duty cycle of CCLK (%), each versus time before and after leakage current compensation for a typical configuration according to one embodiment. Operation is shown with compensation off before a time T and with compensation on after time T. While compensation is off, EXTAL and XTAL (not shown) each begin to oscillate but are separated from each other by the DC voltage offset illustrated by EXTAL_DC versus XTAL_DC. CCLK begins to oscillate (as illustrated by shaded region) but such oscillation is not considered successful since the duty cycle of CCLK is skewed at about 70% without compensation because of the DC voltage offset. When compensation is turned on, XTAL_DC merges with EXTAL_DC to minimize the DC voltage offset between EXTAL and XTAL. As a result, CCLK achieves successful stable oscillation with a duty cycle that achieves an optimal value of about 50%.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

We claim:

1. A compensation system for a crystal oscillator, wherein the crystal oscillator includes an amplifier with a feedback resistance coupled between first and second nodes of first and second pads coupled to first and second terminals, respectively, of a crystal resonator, the compensation system comprising:

a DC level comparator that is configured to compare a DC level of the first node with a DC level of the second node and to provide a compensation signal indicative thereof; and current compensation circuitry that is configured to apply a compensation current to the first node; and a compensation controller that is configured to control a magnitude and direction of the compensation current based on the compensation signal.

2. The compensation system of claim 1, wherein the DC level comparator comprises:

a first filter coupled to the first node that is configured to provide a first DC level of the first node;

a second filter coupled to the second node that is configured to provide a second DC level of the second node; and a hysteretic comparator having inputs receiving the first and second DC levels and having an output providing the compensation signal.

3. The compensation system of claim 1, wherein the current compensation circuitry comprises a current generator that sources the compensation current to or sinks the compensation current from the first node based on a compensation current control signal, and wherein the compensation controller provides the compensation current control signal to select sourcing or sinking the compensation current and to determine a magnitude of the compensation current based on the compensation signal.

4. The compensation system of claim 1, wherein:

the current compensation circuitry comprises:

a plurality of source switches coupled to a corresponding plurality of current sources that are configured to provide the compensation current as a compensation source current that is provided to the first node; and a plurality of sink switches coupled to a corresponding plurality of current sinks that are configured to provide the compensation current as a compensation sink current that is drawn from the first node; and wherein the compensation controller is configured to select between the compensation source current and the compensation sink current based on the compensation signal and to control either the plurality of source switches or the plurality of sink switches to adjust a magnitude of the compensation current based on the compensation signal.

5. The compensation system of claim 4, wherein the compensation controller comprises:

a digital counter that is configured to increment a digital count value when the compensation signal is at a first state and to decrement the digital count value when the compensation signal is at a second state, wherein a most significant bit of the digital count value comprises a direction bit that indicates the compensation source current or the compensation sink current;

output select circuitry that is configured to select the digital count value as a source control value to control the plurality of source switches when the direction bit indicates the compensation source current, and to select the digital count value as a sink control value to control the plurality of sink switches when the direction bit indicates the compensation sink current; and a transition detector that is configured to lock compensation upon detecting a transition of the compensation signal between the first and second states.

6. The compensation system of claim 5, wherein the compensation controller further comprises delay circuitry that is configured to delay for a time period after compensation is locked and then to reset the transition detector to unlock the transition detector.

7. The compensation system of claim 1, further comprising:

the compensation controller comprising a digital controller receiving a selected clock signal;

a clock generator having inputs coupled to the first and second nodes and having an output providing a crystal oscillator clock signal, wherein the clock generator is configured to transition a clock select signal from a first state to a second state when the crystal oscillator clock signal achieves stable oscillation with a duty cycle within a predetermined margin of error; and select circuitry that is configured to select an external clock signal as the selected clock signal when the clock select signal is at the first state and to select the crystal oscillator clock signal as the selected clock signal when the clock select signal is at the second state.

8. A crystal oscillator, comprising:

an amplifier having an input coupled to an input terminal and an output coupled to an output terminal for driving a crystal resonator coupled between the input and output terminals;

a DC level comparator that is configured to compare a DC level of the input terminal with a DC level of the output terminal and to provide a compensation signal indicative thereof;

current compensation circuitry that is configured to apply a compensation current to the input terminal; and a compensation controller that is configured to control a magnitude and direction of the compensation current based on the compensation signal.

9. The crystal oscillator of claim 8, wherein the DC level comparator comprises:

a first filter coupled to the input terminal that is configured to provide a first DC level of the input terminal;

a second filter coupled to the second pad that is configured to provide a second DC level of the second pad; and a hysteretic comparator having inputs receiving the first and second DC levels and having an output providing the compensation signal.

10. The crystal oscillator of claim 8, wherein the current compensation circuitry comprises a current generator that sources the compensation current to or sinks the compensation current from the input terminal based on a compensation current control signal, and wherein the compensation controller provides the compensation current control signal to select sourcing or sinking the compensation current and to determine a magnitude of the compensation current based on the compensation signal.

11. The crystal oscillator of claim 8, wherein:

the current compensation circuitry comprises:

a plurality of source switches coupled to a corresponding plurality of current sources that are configured to provide the compensation current as a compensation source current that is provided to the input terminal; and a plurality of sink switches coupled to a corresponding plurality of current sinks that are configured to provide the compensation current as a compensation sink current that is drawn from the input terminal; and wherein the compensation controller is configured to select between the compensation source current and the compensation sink current based on the compensation signal and to control either the plurality of source switches or the plurality of sink switches to adjust a magnitude of the compensation current based on the compensation signal.

12. The crystal oscillator of claim 11, wherein the compensation controller comprises:

a digital counter that is configured to increment a digital count value when the compensation signal is at a first state and to decrement the digital count value when the compensation signal is at a second state, wherein a most significant bit of the digital count value comprises a direction bit that indicates the compensation source current or the compensation sink current;

output select circuitry that is configured to select the digital count value as a source control value to control the plurality of source switches when the direction bit indicates the compensation source current, and to select the digital count value as a sink control value to control the plurality of sink switches when the direction bit indicates the compensation sink current; and a transition detector that is configured to lock compensation upon detecting a transition of the compensation signal between the first and second states.

13. The crystal oscillator of claim 12, wherein the compensation controller further comprises delay circuitry that is configured to wait for a time period after compensation is locked and then to reset the transition detector to unlock the transition detector.

14. The crystal oscillator of claim 8, further comprising:

the compensation controller comprising a digital controller receiving a selected clock signal;

a clock generator having inputs coupled to the input and output terminals and having an output providing a crystal oscillator clock signal, wherein the clock generator is configured to transition a clock select signal from a first state to a second state when the crystal oscillator clock signal achieves stable oscillation with a duty cycle within a predetermined margin of error; and select circuitry that is configured to select an external clock signal as the selected clock signal when the clock select signal is at the first state and to select the crystal oscillator clock signal as the selected clock signal when the clock select signal is at the second state.

15. A method of compensating for leakage current for a crystal oscillator, comprising:

comparing a DC level of an input terminal with a DC level of an output terminal and providing a compensation signal indicative thereof;

when the compensation signal is in a first state, providing a source compensation current to the input terminal and adjusting a level of the source compensation current until a net current through the input terminal is less than a predetermined maximum level; and when the compensation signal is in the second state, drawing a sink compensation current from the input terminal and adjusting a level of the sink compensation current until the net current through the input terminal is less than the predetermined maximum level.

16. The method of claim 15, wherein the adjusting the level of the source compensation current comprises adjusting the level of the source compensation current until the compensation signal transitions to the second state, and wherein the adjusting the level of the sink compensation current comprises adjusting the level of the sink compensation current until the compensation signal transitions to the first state.

17. The method of claim 15, further comprising:

incrementing a digital count value when the compensation signal is at the first state or decrementing the digital count value when the compensation signal is at the second state;

using a most significant bit of the digital count value as a direction bit that indicates the source compensation current or the sink compensation current; and applying the digital count value as a source control value to activate selected ones of a plurality of source switches when the direction bit indicates the source compensation current, and applying the digital count value as a sink control value to activate selected ones of a plurality of sink switches when the direction bit indicates the sink compensation current.

18. The method of claim 17, further comprising locking compensation upon detecting a transition of the compensation signal between the first and second states.

19. The method of claim 18, further comprising delaying for a time period after compensation is locked and then unlocking compensation and repeating the incrementing or decrementing, using, applying, and locking compensation.

20. The method of claim 15, further comprising:

using a selected clock signal for adjusting a level of the source compensation current or for adjusting a level of the sink compensation current;

generating a crystal clock signal using oscillations of the input and output terminals;

determining when the crystal clock signal is successful by achieving stable oscillation with a duty cycle within a predetermined margin of error; and selecting an external clock signal as the selected clock signal when the crystal clock signal is not successful and selecting the crystal clock signal as the selected clock signal when the crystal clock signal is successful.

* * * * *